(12) United States Patent
Kurachi

(10) Patent No.: US 11,395,426 B2
(45) Date of Patent: Jul. 19, 2022

(54) COVER FOR ELECTRONIC APPARATUS AND ELECTRONIC APPARATUS

(71) Applicant: NEC Platforms, Ltd., Kawasaki (JP)

(72) Inventor: Hidekazu Kurachi, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 95 days.

(21) Appl. No.: 16/762,973

(22) PCT Filed: Dec. 13, 2019

(86) PCT No.: PCT/JP2019/048954
§ 371 (c)(1),
(2) Date: May 11, 2020

(87) PCT Pub. No.: WO2020/153043
PCT Pub. Date: Jul. 30, 2020

(65) Prior Publication Data
US 2021/0219447 A1    Jul. 15, 2021

(30) Foreign Application Priority Data

Jan. 22, 2019   (JP) .............................. JP2019-008372

(51) Int. Cl.
*H05K 5/03*     (2006.01)
*H05K 5/02*     (2006.01)
*H04M 1/02*     (2006.01)

(52) U.S. Cl.
CPC ............ *H05K 5/03* (2013.01); *H04M 1/0297* (2013.01); *H05K 5/0239* (2013.01)

(58) Field of Classification Search
CPC .............................. H05K 5/0239; H05K 5/03
See application file for complete search history.

(56) References Cited

U.S. PATENT DOCUMENTS

| 7,149,559 B2 | 12/2006 | Qin et al. |
| 2005/0134570 A1 | 6/2005 | Strawn et al. |
| 2007/0172336 A1* | 7/2007 | Hsu .......................... F16B 5/065 411/508 |

(Continued)

FOREIGN PATENT DOCUMENTS

| CN | 201263263 Y | 6/2009 |
| CN | 201303361 Y | 9/2009 |

(Continued)

OTHER PUBLICATIONS

Chinese Office Action for CN Application No. 201980005915.2 dated Dec. 30, 2020 with English Translation.

(Continued)

*Primary Examiner* — Hung V Ngo

(57) ABSTRACT

A cover for an electronic apparatus by which the manufacturing cost of the electronic apparatus can be reduced is provided. A cover for an electronic apparatus includes through holes into which buttons of the electronic apparatus are inserted. Each through hole is surrounded by a first arc part, a second arc part positioned to be opposed to the first arc part, a first projection part forming a rectangular area projecting from one end of the first arc part and one end of the second arc part and a second projection part forming a rectangular area projecting from the other end of the first arc part and the other end of the second arc part.

4 Claims, 18 Drawing Sheets

(56) References Cited

U.S. PATENT DOCUMENTS

2011/0157782 A1  6/2011  Shen et al.

FOREIGN PATENT DOCUMENTS

| | | |
|---|---|---|
| CN | 205725872 U | 11/2016 |
| CN | 206136021 U | 4/2017 |
| CN | 107644751 A | 1/2018 |
| EP | 0773609 A1 | 5/1997 |
| JP | 63-070629 U | 5/1988 |
| JP | 02-089882 U | 7/1990 |
| JP | 11-306903 A | 11/1999 |
| JP | 2007-199658 A | 8/2007 |
| JP | 2012-106750 A | 6/2012 |
| TW | M358501 U | 6/2009 |

OTHER PUBLICATIONS

Supplementary European Search Report (SESR) for EP Application No. EP 19886037.1 dated May 21, 2021.
International Search Report for PCT/JP2019/048954 dated Mar. 3, 2020 [PCT/ISA/210].

* cited by examiner

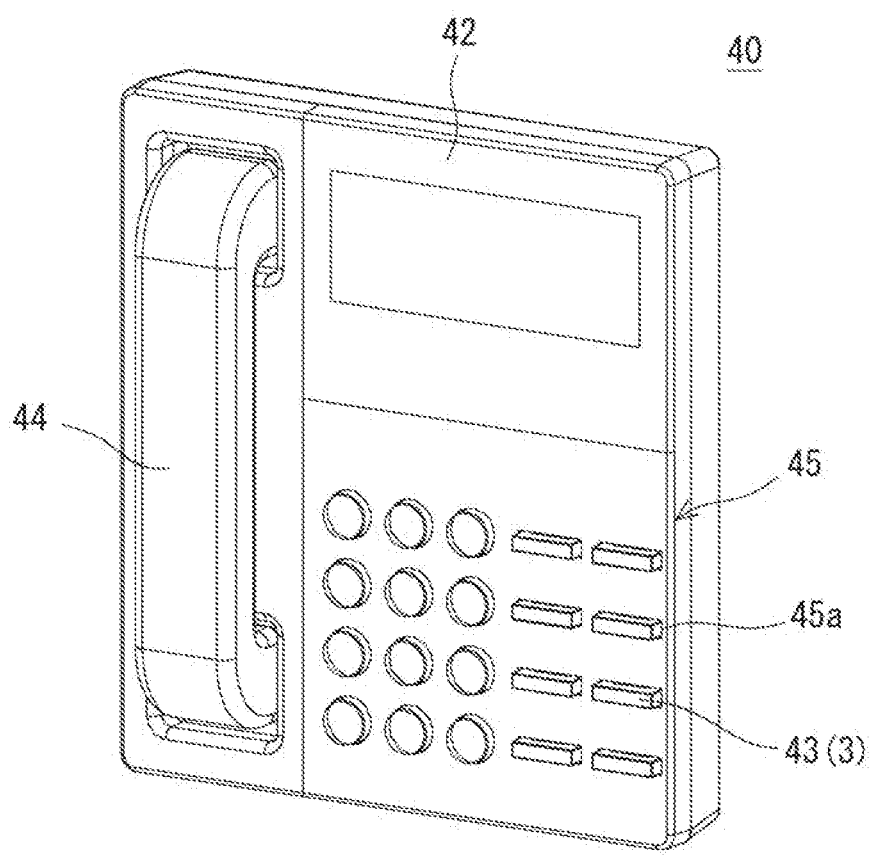
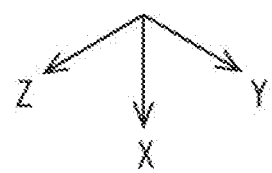
Fig. 16

COVER FOR ELECTRONIC APPARATUS AND ELECTRONIC APPARATUS

CROSS REFERENCE TO RELATED APPLICATIONS

This application is a National Stage of International Application No. PCT/JP2019/048954 filed Dec. 13, 2019, claiming priority based on Japanese Patent Application No. 2019-008372 filed Jan. 22, 2019, the disclosure of which is incorporated herein in its entirety by reference.

TECHNICAL FIELD

The present disclosure relates to a cover for an electronic apparatus and an electronic apparatus.

BACKGROUND ART

As disclosed in Patent Literature 1, an electronic apparatus typified by an ordinary desk telephone is configured so that an operator operates it through buttons. As the buttons, circular buttons and/or rectangular buttons are adopted.

Further, as shown in FIGS. 17A and 17B, each circular button 101 is disposed in an electronic apparatus in a state where it is passed through a corresponding through hole 102a formed in a first cover 102 and a corresponding through hole 103a formed in a second cover 103. Further, in a similar manner, as shown in FIGS. 18A and 18B, each rectangular button 201 is disposed in the electronic apparatus in a state where it is passed through a corresponding through hole 202a formed in a first cover 202 and a corresponding through hole 203a formed in a second cover 203.

Note that the through hole 102a of the first cover 102 and the through hole 103a of the second cover 103 are formed in a circular shape so as to conform to the shape of the circular button 101. Further, the through hole 202a of the first cover 202 and the through hole 203a of the second cover 203 are formed in a rectangular shape so as to conform to the shape of the rectangular button 201.

Note that each of FIGS. 17A and 18A shows a state in which the buttons, the first cover, and the second cover are separated from one another, and each of FIGS. 17B and 18B shows a state in which the buttons have been passed through the through holes of the first and second covers.

CITATION LIST

Patent Literature

Patent Literature 1: Japanese Unexamined Utility Model Application Publication No. H2-89882

SUMMARY OF INVENTION

Technical Problem

As shown in FIGS. 17A, 17B, 18A and 18B, through holes formed in an ordinary first cover are formed in shapes that conform to the shapes of buttons. Therefore, there is a problem that it is necessary to prepare the first cover according to the shapes of buttons and hence the manufacturing cost of the electronic apparatus increases.

One of the objects that an example embodiment disclosed in this specification is intended to achieve is to provide a cover for an electronic apparatus and an electronic apparatus capable of contributing to a solution of the above-described problem. It should be noted that this object is merely one of a plurality of objects that example embodiments disclosed in this specification are intended to achieve. Other objects or problems and novel features will be made apparent from the following description and the accompanying drawings.

Solution to Problem

A cover for an electronic apparatus according to a first aspect includes a through hole into which a button of the electronic apparatus is inserted, in which
the through hole is surrounded by:
a first arc part centered at a predefined point;
a second arc part positioned to be opposed to the first arc part in a first direction parallel to a surface of the cover, the second arc part being centered at the predefined point and having a diameter equal to that of the first arc part;
a first projection part forming a rectangular area projecting from one end of the first arc part and one end of the second arc part, the rectangular area projecting outward with respect to the predefined point in a second direction, the second direction being parallel to the surface of the cover and orthogonal to the first direction; and
a second projection part forming a rectangular area projecting from the other end of the first arc part and the other end of the second arc part, the rectangular area projecting outward with respect to the predefined point in the second direction.

An electronic apparatus according to a second aspect includes:
the above-described cover for the electronic apparatus; and
a button configured to be inserted into the through hole of the cover for the electronic apparatus.

Advantageous Effects of Invention

According to the above-described aspect, it is possible to provide a cover for an electronic apparatus and an electronic apparatus by which the manufacturing cost of the electronic apparatus can be reduced.

BRIEF DESCRIPTION OF DRAWINGS

FIG. 16 is an assembly diagram schematically showing the desk telephone in which the cover and the second buttons according to the example embodiment are used;

DESCRIPTION OF EMBODIMENTS

A best mode for carrying out the present invention will be described hereinafter with reference to the accompanying drawings. However, the present invention is not limited to the below-shown example embodiments. Further, to clarify the explanation, the following description and drawings are simplified as appropriate.

Figure 1:
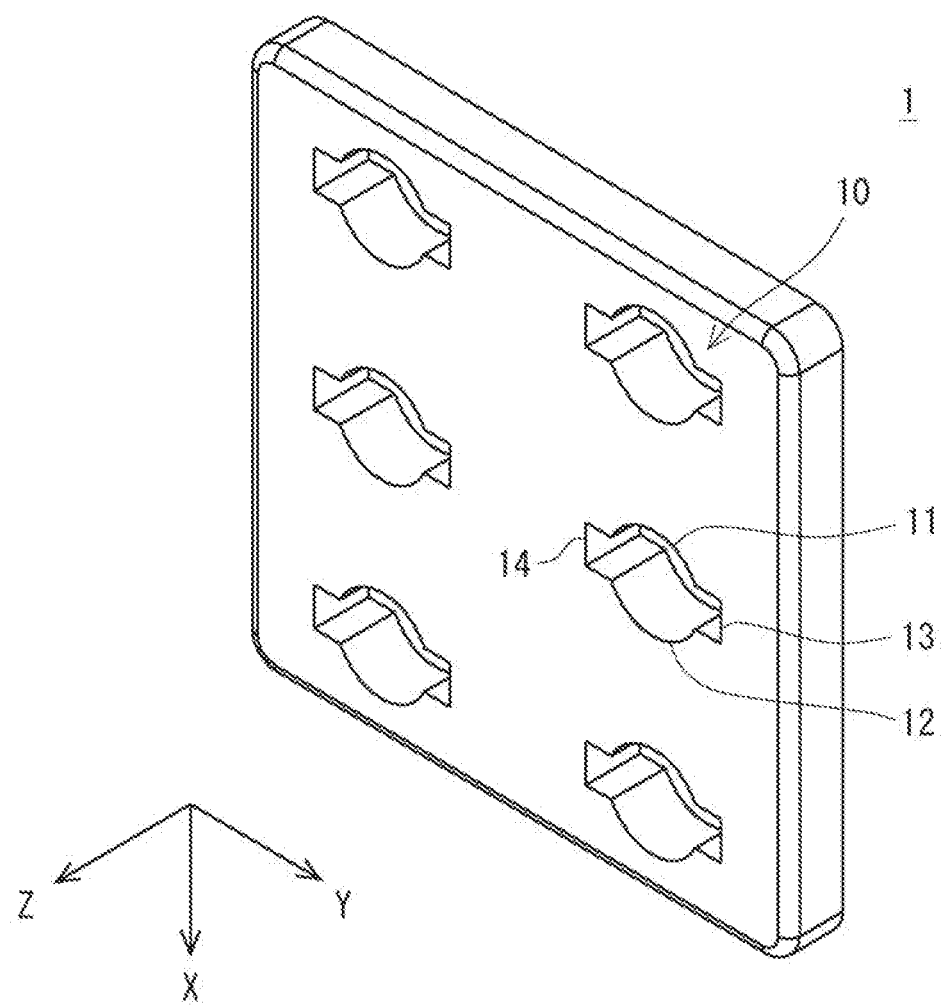
FIG. 1 is a perspective view schematically showing a cover used for an electronic apparatus according to an example embodiment.
Figure 2:
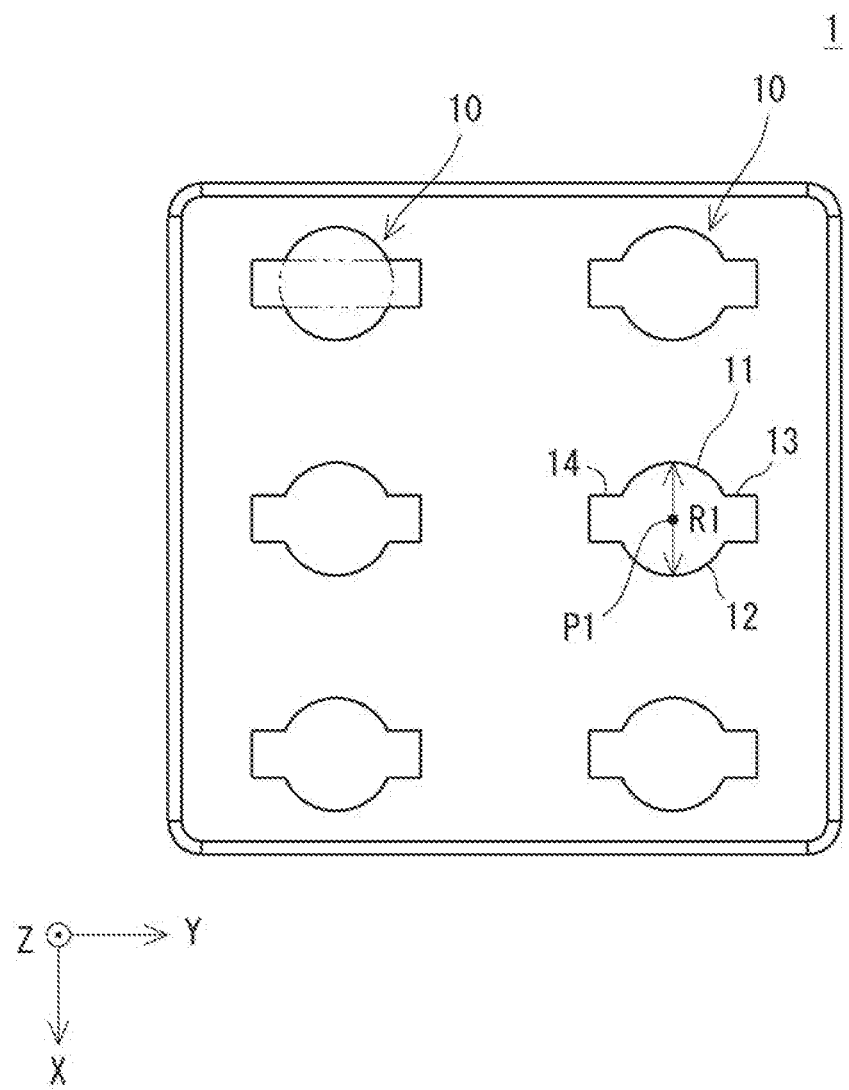
FIG. 2 is a front view schematically showing the cover used for the electronic apparatus according to the example embodiment.

Firstly, a configuration of a cover used for an electronic apparatus according to this example embodiment will be described. FIG. 1 is a perspective view schematically showing a cover used for an electronic apparatus according to this example embodiment. FIG. 2 is a front view schematically showing the cover used for the electronic apparatus according to this example embodiment.

Note that in the following explanation, a three-dimensional (XYZ) coordinate system is used to clarify the description. Note that the X-axis (a first direction) extends in parallel to the surface of the cover, and the Y-axis (a second direction) extends in parallel to the surface of the cover and in a direction orthogonal to the X-axis. Further, the Z-axis extends in a direction orthogonal to the X- and Y-axes. Further, a Z-axis positive side is the front side of the cover and a Z-axis negative side is the rear side of the cover.

A cover 1 shown in FIGS. 1 and 2 is used for an electronic apparatus such as a desk telephone and is, for example, made of resin. Examples to which the cover 1 is applied will be described later. As shown in FIGS. 1 and 2, the cover 1 includes through holes 10 that penetrate the cover 1 in the Z-axis direction. As will be described later, buttons of the electronic apparatus are inserted into the through holes 10.

Specifically, each through hole 10 is surrounded by a first arc part 11, a second arc part 12, a first projection part 13, and a second projection part 14 as viewed in the Z-axis direction. Further, each through hole 10 has a point-symmetric shape centered at a predefined point P1 in the cover 1.

The first arc part 11 is centered at the predefined point P1 and has a first diameter R1. The second arc part 12 is disposed so as to be opposed to the first arc part 11 in the X-axis direction. Further, the second arc part 12 is centered at the predefined point P1 and has the first diameter R1.

The first projection part 13 forms a roughly rectangular area that projects from the ends on the Y-axis positive side of the first and second arc parts 11 and 12, and projects toward the Y-axis positive side with respect to the predefined point P1. That is, the part on the X-axis positive side of the first projection part 13 is roughly parallel to the part on the X-axis negative side thereof, and the part on the Y-axis positive side of the first projection part 13 is roughly orthogonal to the parts on the X-axis positive and negative sides thereof. Further, a straight line connecting the ends on the Y-axis negative side of the parts on the X-axis positive and negative sides of the first projection part 13 is roughly parallel to the part on the Y-axis positive side thereof.

The second projection 14 has a shape that is mirror-symmetric to the shape of the first projection part 13 with a straight line that passes through the predefined point P1 and is parallel to the X-axis being the symmetry axis. The second projection part 14 forms a roughly rectangular area that projects from the ends on the Y-axis negative side of the first and second arc parts 11 and 12, and projects toward the Y-axis negative side with respect to the predefined point P1.

That is, the part on the X-axis positive side of the second projection part 14 is roughly parallel to the part on the X-axis negative side thereof, and the part on the Y-axis negative side of the second projection part 14 is roughly orthogonal to the parts on the X-axis positive and negative sides thereof. Further, a straight line connecting the ends on the Y-axis positive side of the parts on the X-axis positive and negative sides of the second projection part 14 is roughly parallel to the part on the Y-axis negative side thereof.

As shown in FIG. 2, each through hole 10 of the cover 1, which has the above-described shape, can form a circular shape by connecting the first and second arc parts 11 and 12 (indicated by a single-dashed line), and can form a rectangular shape by connecting the first and second projection parts 13 and 14 (indicated by a double-dashed line). Therefore, the buttons of the electronic apparatus can be inserted into the through holes irrespective of whether they are circular buttons or rectangular buttons. Therefore, there is no need to prepare a cover according to the shapes of buttons. Therefore, the versatility of the cover 1 is improved and the manufacturing cost of the electronic apparatus can be reduced.

Note that the first diameter R1 is preferably roughly equal to the diameter of a corresponding circular button that is planned to be adopted in the electronic apparatus in advance. Further, the rectangular shape that is formed by connecting the first and second projection parts 13 and 14 is preferably roughly identical to the shape formed by the peripheral edges of a corresponding rectangular button that is planned to be adopted in the electronic apparatus in advance. In this way, it is possible to improve the design of the external appearance of the electronic apparatus. Further, it is possible to prevent or minimize the formation of gaps between the through holes 10 of the cover 1 and the buttons of the electronic apparatus.

Figure 3:
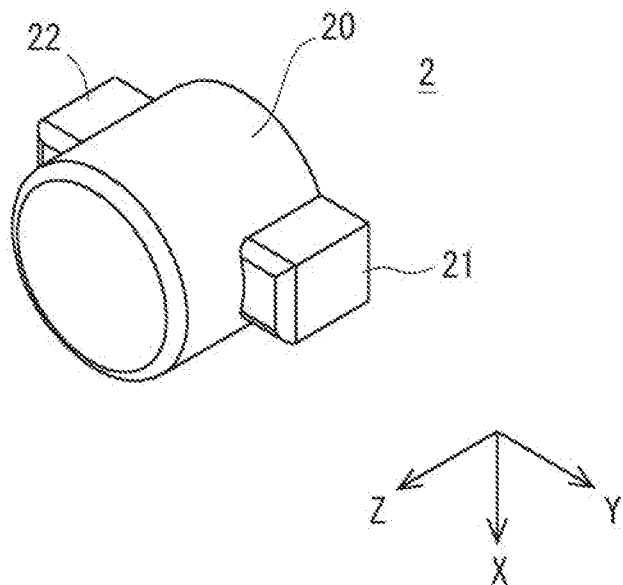
FIG. 3 is a perspective view schematically showing one of first buttons according to an example embodiment.
Figure 4:
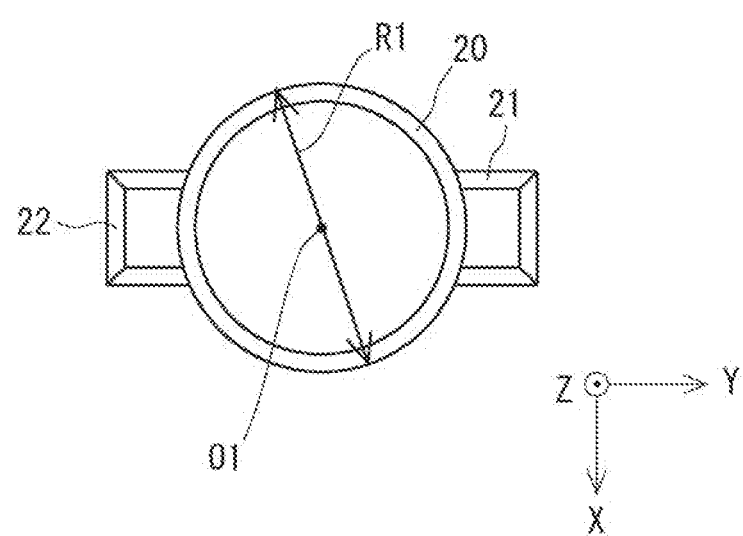
FIG. 4 is a front view schematically showing the first button according to the example embodiment.
Figure 5:
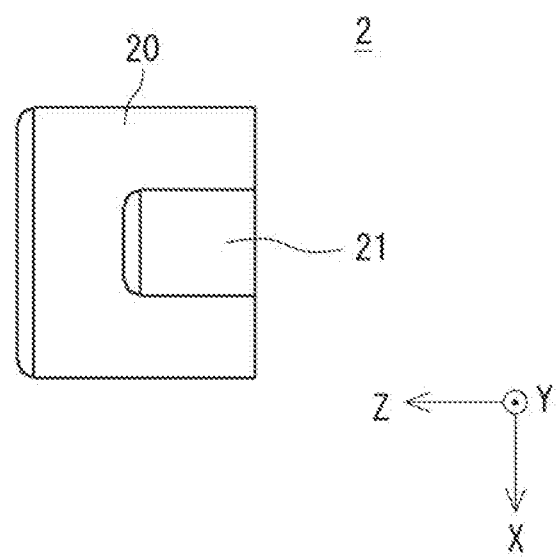
FIG. 5 is a side view schematically showing the first button according to the example embodiment.
Figure 6:
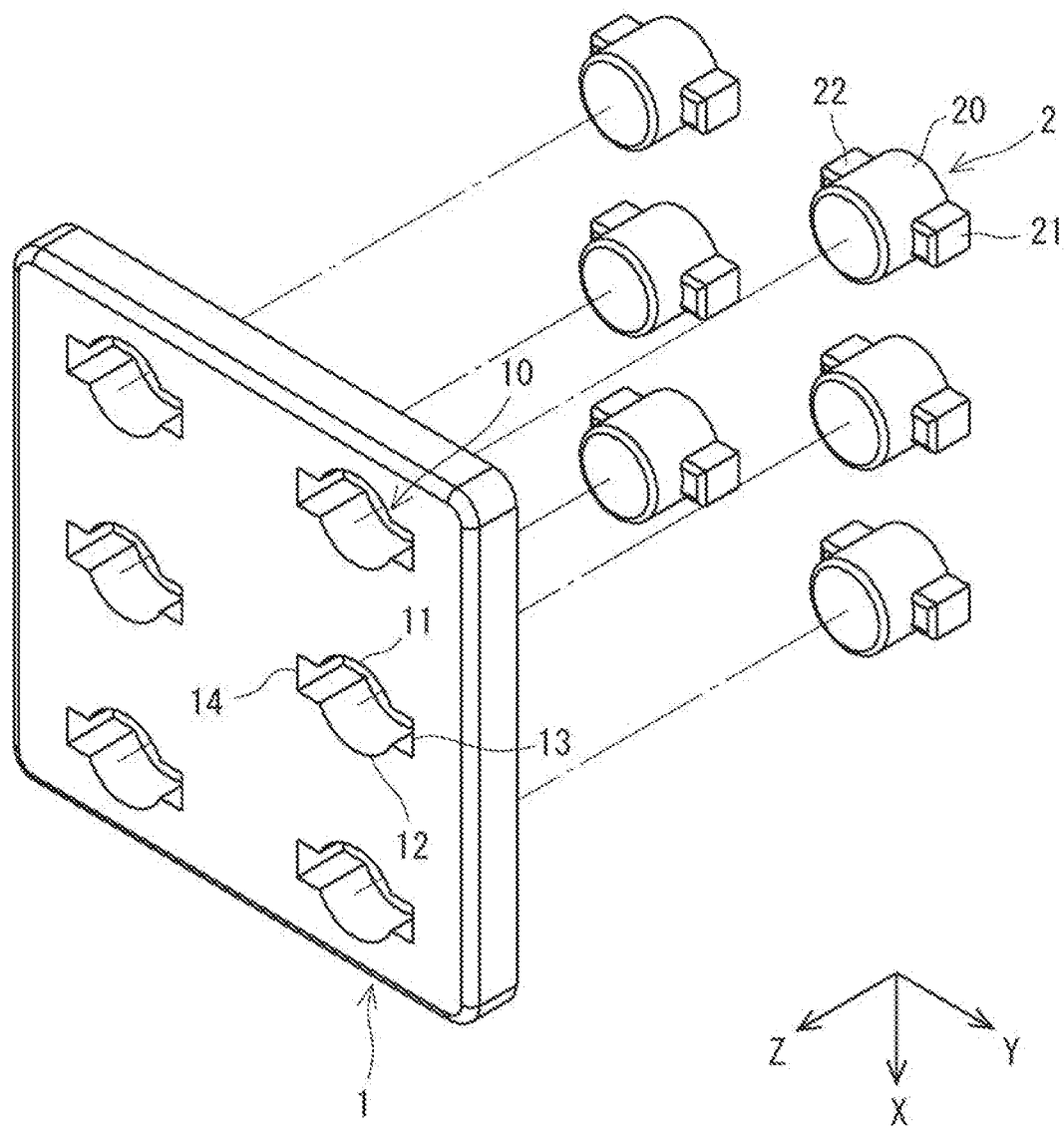
FIG. 6 is a perspective view schematically showing a state in which first buttons are inserted into through holes formed in a cover according to an example embodiment.
Figure 7:
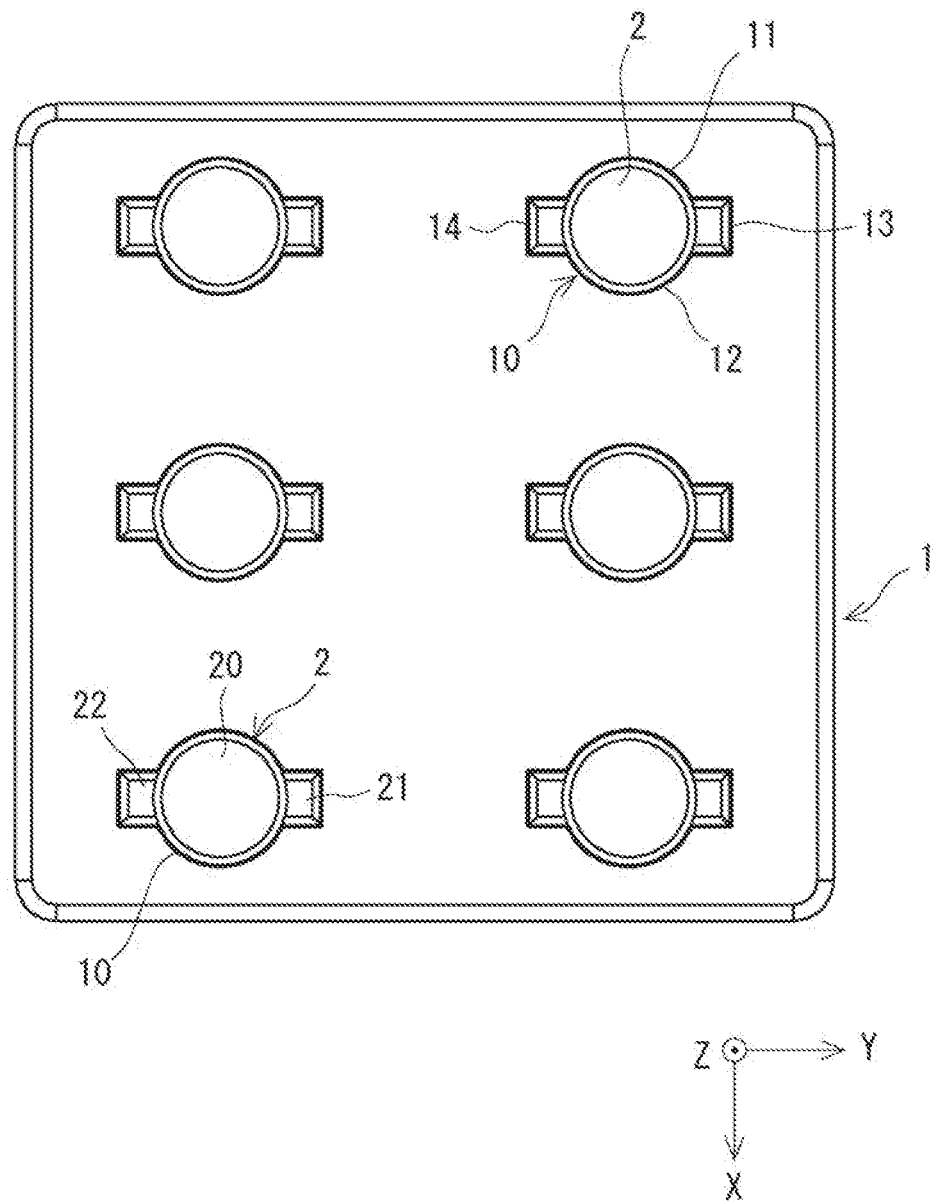
FIG. 7 is a front view schematically showing a state in which the first buttons have been inserted into the through holes of the cover according to the example embodiment.

Next, a preferred configuration of a button that is inserted into a through hole 10 formed in the cover 1 according to this example embodiment will be described. Firstly, first buttons whose basic forms are circular buttons will be described. FIG. 3 is a perspective view schematically showing one of first buttons according to this example embodiment. FIG. 4 is a front view schematically showing the first button according to this example embodiment. FIG. 5 is a side view schematically showing the first button according to this example embodiment. FIG. 6 is a perspective view schematically showing a state in which the first buttons are inserted into through holes formed in the cover according to this example embodiment. FIG. 7 is a front view schematically showing a state in which the first buttons have been inserted into the through holes of the cover according to this example embodiment.

As described above, the first button 2 shown in FIGS. 3 to 5 adopts a circular button as its basic form and is, for example, made of resin. Specifically, as shown in FIGS. 3 to 5, the first button 2 is formed so as to be point-symmetric around a central axis O1 of the first button 2. Further, the first button 2 includes a body part 20, a first projection part 21, and a second projection part 22.

The body part 20 has a roughly circular shape as viewed in the Z-axis direction and extends in the Z-axis direction. That is, the body part 20 has a roughly columnar shape extending in the Z-axis direction. Further, the body part 20 has a diameter roughly equal to the first diameter R1 so that it can be inserted into the through hole 10 of the cover 1.

The first projection part 21 projects from the part on the Z-axis negative side of the body part 20 toward the Y-axis positive side. The first projection part 21 has peripheral edges roughly identical to those of the first projection part 13 of the through hole 10 of the cover 1 so that the first projection part 21 can be inserted into the first projection part 13.

That is, the first projection part 21 has a roughly rectangular shape as viewed in the Z-axis direction and extends in the Z-axis direction so that its shape conforms to the shape of the first projection part 13 of the through hole 10 of the cover 1. In other words, the first projection part 21 has a roughly rectangular column shape extending in the Z-axis direction.

Therefore, the side on the X-axis positive side of the first projection part 21 is roughly parallel to the side on the X-axis negative side thereof, and the side on the Y-axis positive side of the first projection part 21 is roughly orthogonal to the sides on the X-axis positive and negative sides thereof. Further, a straight line connecting the ends on the Y-axis negative side of the sides on the X-axis positive and negative sides of the first projection part 21 is roughly parallel to the side on the Y-axis positive side thereof.

The second projection part 22 projects from the part on the Z-axis negative side of the body part 20 toward the Y-axis negative side so that the second projection part 22 is opposed to the first projection part 21. The second projection part 22 has peripheral edges roughly identical to those of the second projection part 14 of the through hole 10 of the cover 1 so that the second projection part 22 can be inserted into the second projection part 14.

That is, the second projection part 22 has a roughly rectangular shape as viewed in the Z-axis direction and extends in the Z-axis direction so that its shape conforms to the shape of the second projection part 14 of the through hole 10 of the cover 1. In other words, the second projection part 22 has a roughly rectangular column shape extending in the Z-axis direction.

Therefore, the side on the X-axis positive side of the second projection part 22 is roughly parallel to the side on the X-axis negative side thereof, and the side on the Y-axis negative side of the second projection part 22 is roughly orthogonal to the sides on the X-axis positive and negative sides thereof. Further, a straight line connecting the ends on the Y-axis positive side of the sides on the X-axis positive and negative sides of the second projection part 22 is roughly parallel to the side on the Y-axis negative side thereof.

Since the first button 2 has a shape conforming to that of the through hole 10 of the cover 1 as described above, it can be inserted into the through hole 10 of the cover 1 as shown in FIGS. 6 and 7. That is, the first button 2, whose basic form is a circular button, can be inserted into the through hole 10 of the cover 1.

Further, the first and second projection parts 21 and 22 of the first button 2 are inserted into the first and second projection parts 13 and 14, respectively, of the through hole 10 of the cover 1. Therefore, it is possible to prevent a foreign substance from entering from any parts of the through hole 10 of the cover 1 other than the part thereof into which the body part 20 of the first button 2 is inserted.

In addition, in a state where the first button 2 is inserted into the through hole 10 of the cover 1, roughly the entire area of the peripheral edges of the first button 2 is restrained by the peripheral edges of the through hole 10 of the cover 1. Therefore, it is possible to prevent the first button 2 from rattling.

Figure 8:
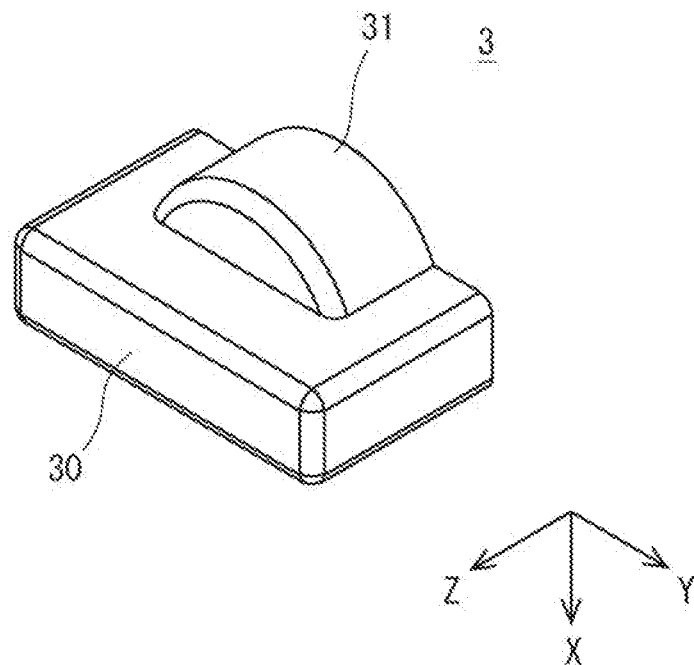
FIG. 8 is a perspective view schematically showing one of second buttons according to an example embodiment.
Figure 9:
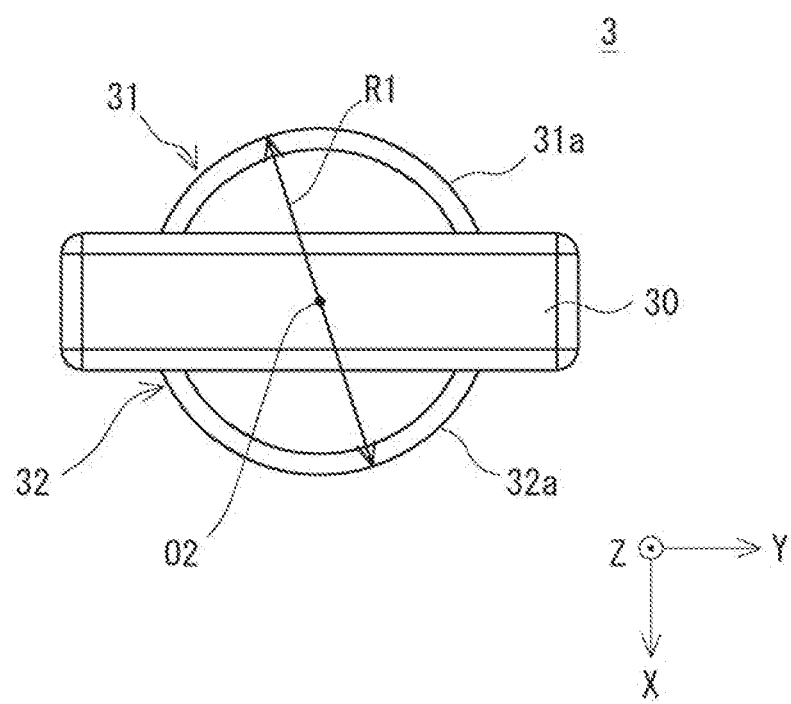
FIG. 9 is a front view schematically showing the second button according to the example embodiment.
Figure 10:
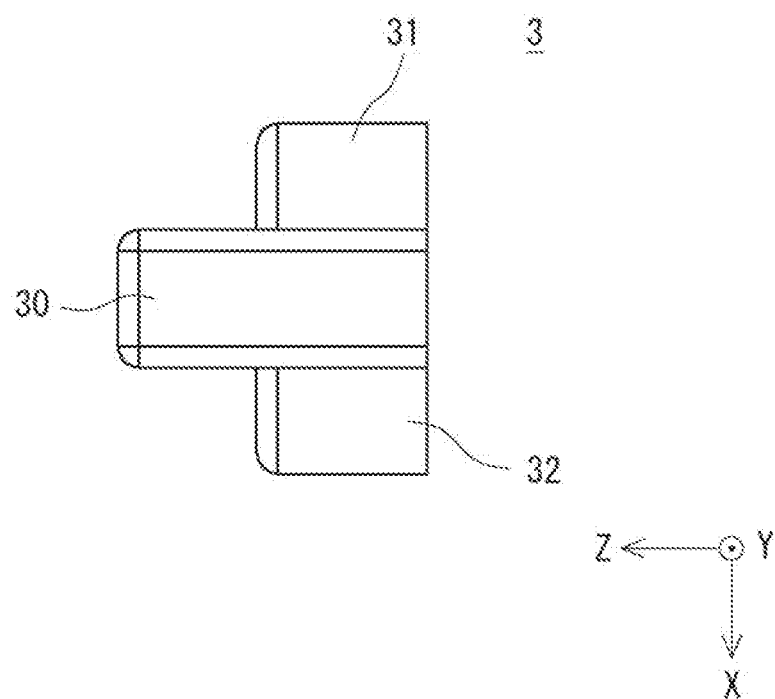
FIG. 10 is a side view schematically showing the second button according to the example embodiment.
Figure 11:
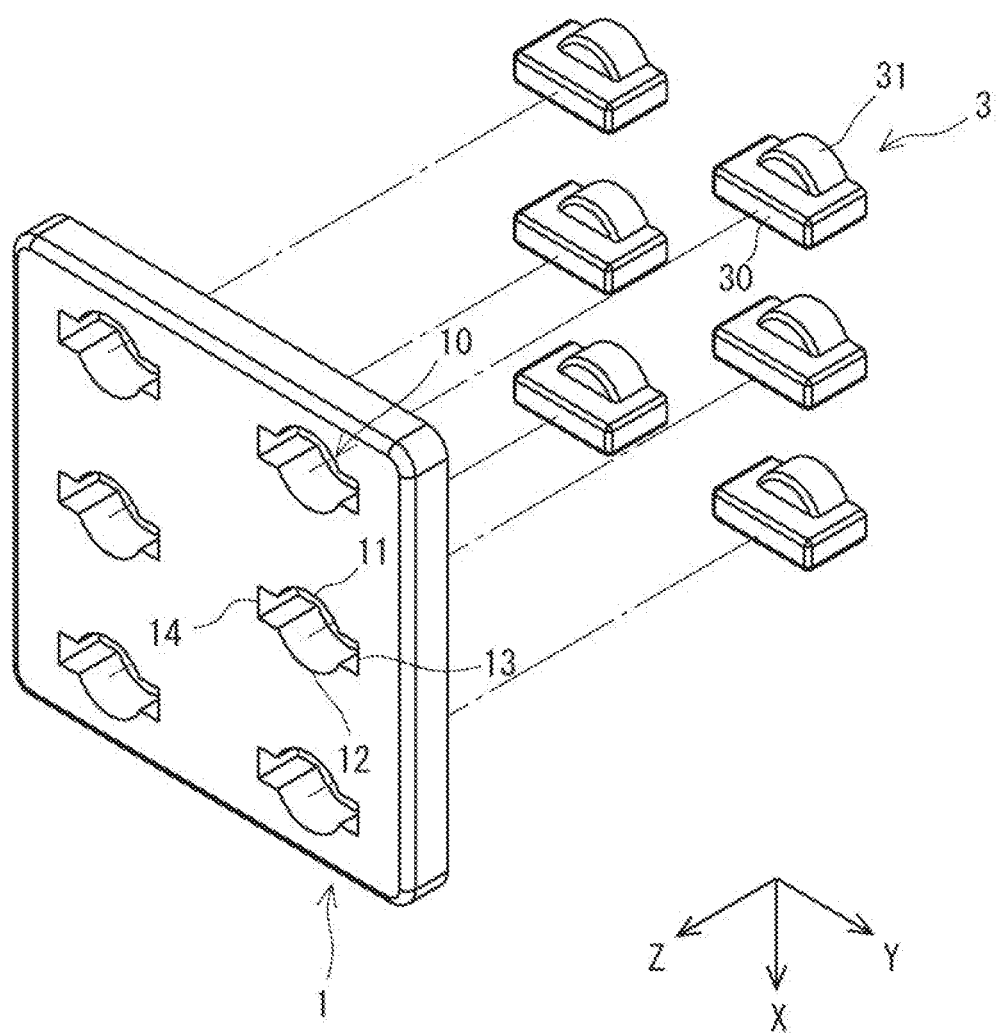
FIG. 11 is a perspective view schematically showing a state in which second buttons are inserted into through holes formed in a cover according to an example embodiment.
Figure 12:
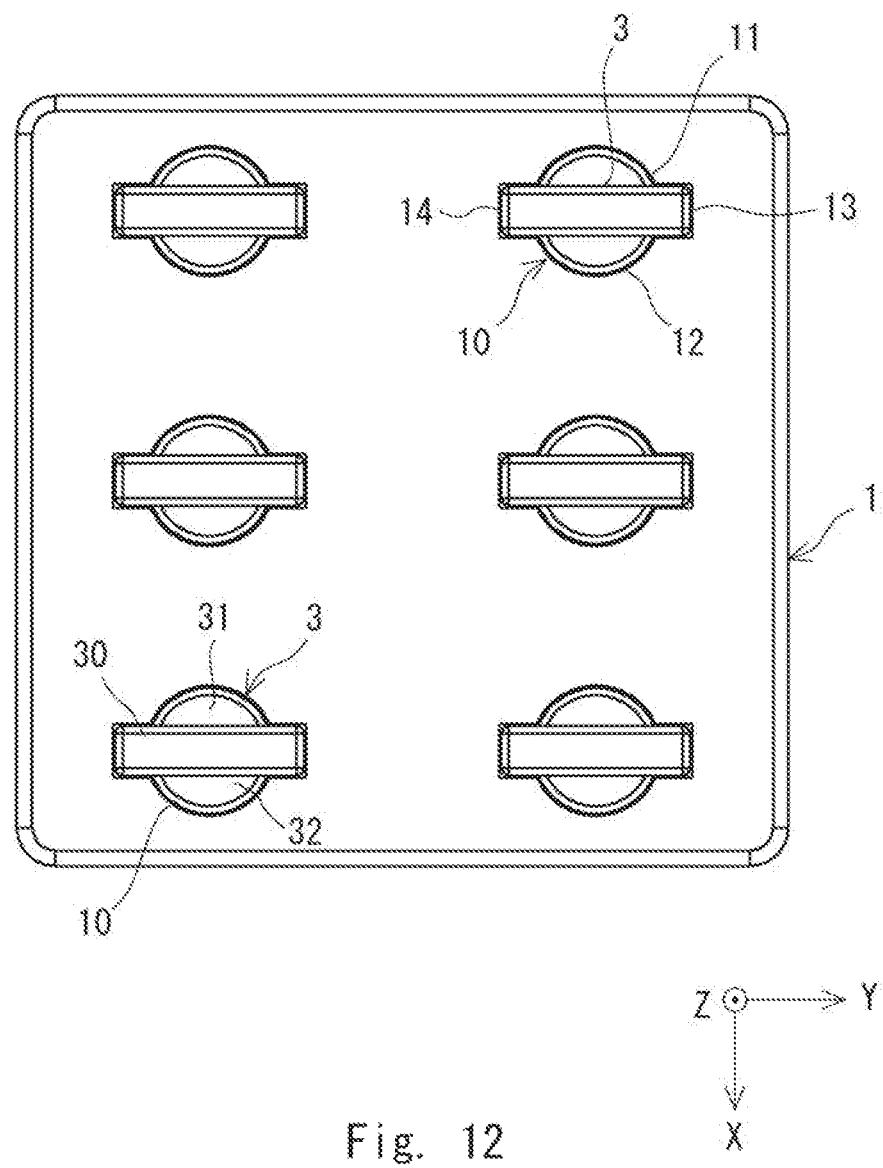
FIG. 12 is a front view schematically showing a state in which the second buttons have been inserted into the through holes of the cover according to the example embodiment.

Next, second buttons whose basic forms are rectangular buttons will be described. FIG. 8 is a perspective view schematically showing one of second buttons according to this example embodiment. FIG. 9 is a front view schematically showing the second button according to this example embodiment. FIG. 10 is a side view schematically showing the second button according to this example embodiment. FIG. 11 is a perspective view schematically showing a state in which the second buttons are inserted into through holes formed in the cover according to this example embodiment. FIG. 12 is a front view schematically showing a state in which the second buttons have been inserted into the through holes of the cover according to this example embodiment.

As described above, the second button 3 shown in FIGS. 8 to 10 adopts a rectangular button as its basic form and is, for example, made of resin. Specifically, as shown in FIGS. 8 to 10, the second button 3 is formed so as to be point-symmetric around a central axis O2 of the second button 3. Further, the second button 3 includes a body part 30, a first projection part 31, and a second projection part 32.

The body part 30 has a roughly rectangular shape as viewed in the Z-axis direction and extends in the Z-axis direction. In other words, the body part 30 has a roughly rectangular column shape extending in the Z-axis direction. Further, the peripheral edges on both sides in the Y-axis direction of the body part 30 are formed roughly identical to those of the first and second projection parts 13 and 14 so that they can be inserted into the first and second projection parts 13 and 14 of the through hole 10 of the cover 1. That is, the shape of the body part 30 conforms to a rectangular shape that is formed by connecting the first and second projection parts 13 and 14 of the through hole 10 of the cover 1 as viewed in the Z-axis direction.

The first projection part 31 projects from the part on the Z-axis negative side of the body part 30 toward the X-axis negative side. Further, the first projection part 31 has a peripheral edge roughly identical to that of the first arc part 11 of the through hole 10 of the cover 1 as viewed in the Z-axis direction so that it can be inserted into the first arc part 11 of the through hole 10 of the cover 1.

That is, as shown in FIG. 9, the first projection part 31 has an arcuate column shape in which an arcuate projection surrounded by an arc part 31a that is centered at the central axis O2 of the second button 3 and has a diameter roughly equal to the first diameter R1 and the side on the X-axis negative side of the body part 30 extends in the Z-axis direction.

The second projection part 32 projects from the part on the Z-axis negative side of the body part 30 toward the X-axis positive side so that it is opposed to the first projection part 31. Further, the second projection part 32 has a peripheral edge roughly identical to that of the second arc part 12 of the through hole 10 of the cover 1 as viewed in the Z-axis direction so that it can be inserted into the second arc part 12 of the through hole 10 of the cover 1.

That is, as shown in FIG. 9, the second projection part 32 has an arcuate column shape in which an arcuate projection surrounded by an arc part 32a that is centered at the central axis O2 of the second button 3 and has a diameter roughly equal to the first diameter R1 and the side on the X-axis positive side of the body part 30 extends in the Z-axis direction.

Since the second button 3 has a shape conforming to that of the through hole 10 of the cover 1 as described above, it can be inserted into the through hole 10 of the cover 1 as shown in FIGS. 11 and 12. That is, the second button 3, whose basis form is a rectangular shape, can also be inserted into the through hole 10 of the cover 1.

Further, the first and second projection parts 31 and 32 of the second button 3 are inserted into the first and second arc parts 11 and 12, respectively, of the through hole 10 of the cover 1. Therefore, it is possible to prevent a foreign substance from entering from any parts of the through hole 10 of the cover 1 other than the part thereof into which the body part 30 of the second button 3 is inserted.

In addition, in a state where the second button 3 is inserted into the through hole 10 of the cover 1, roughly the entire area of the peripheral edges of the second button 3 is restrained by the peripheral edges of the through hole 10 of the cover 1. Therefore, it is possible to prevent the second button 3 from rattling.

Figure 13:
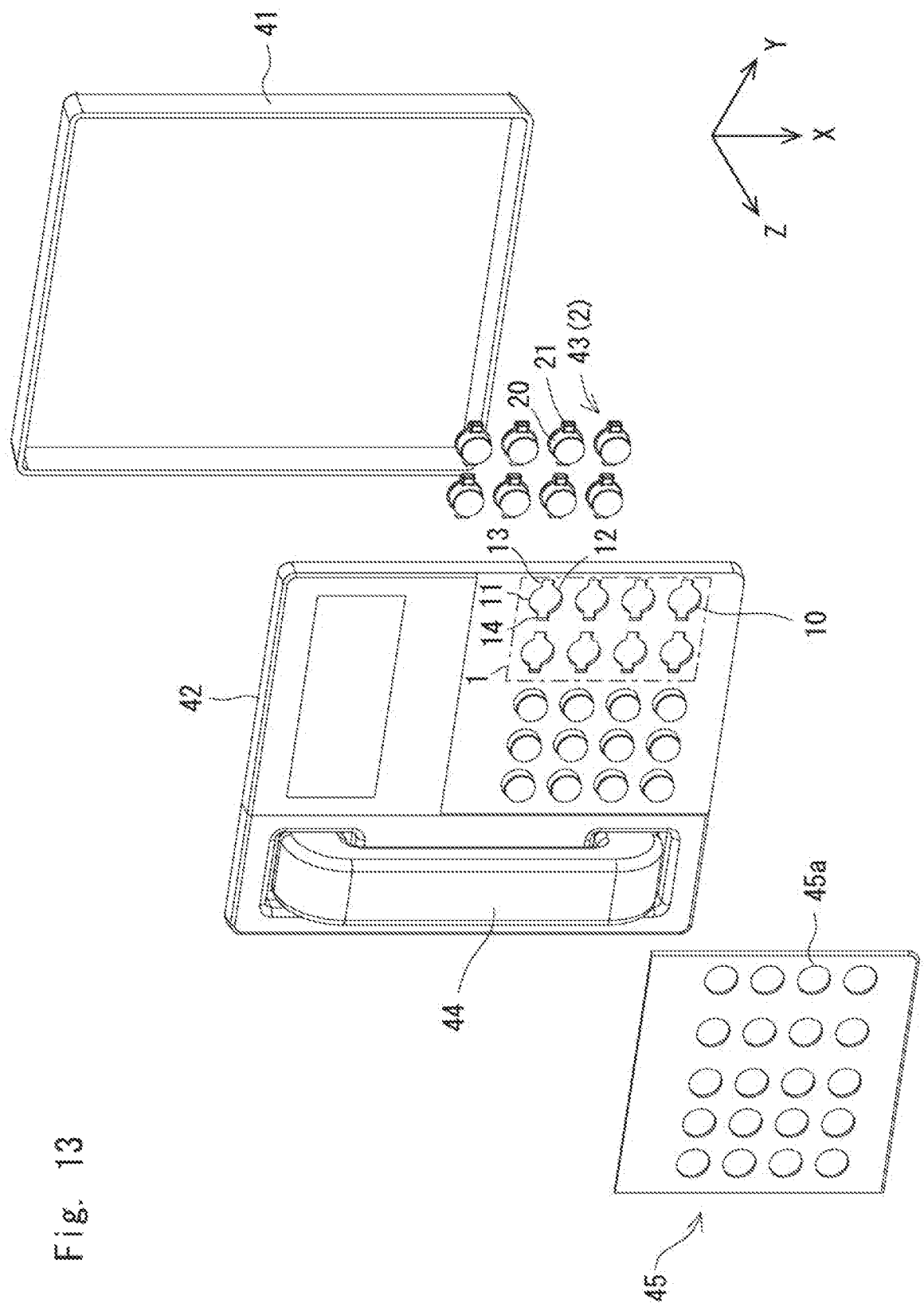
FIG. 13 is an exploded view schematically showing a desk telephone in which a cover and first buttons according to an example embodiment are used.
Figure 14:
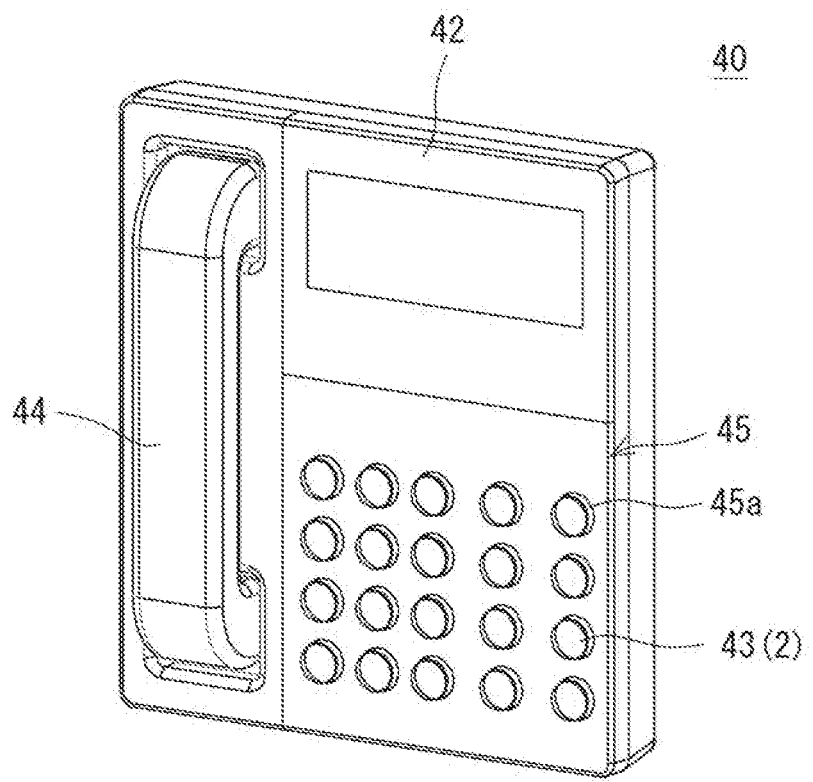
FIG. 14 is an assembly diagram schematically showing the desk telephone in which the cover and the first buttons according to the example embodiment are used.
Figure 15:
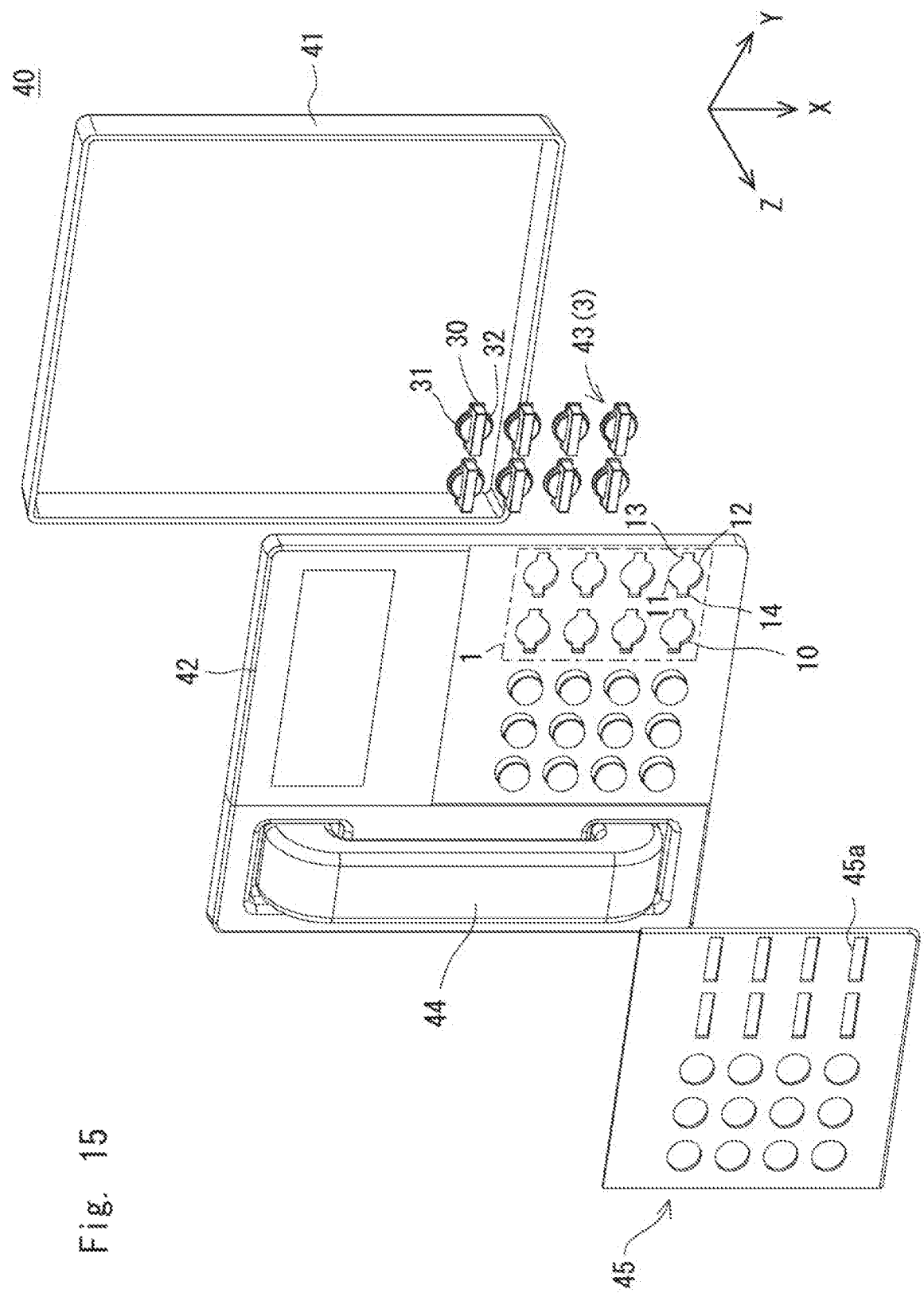
FIG. 15 is an exploded view schematically showing a desk telephone in which a cover and second buttons according to an example embodiment are used.
Figure 17A:
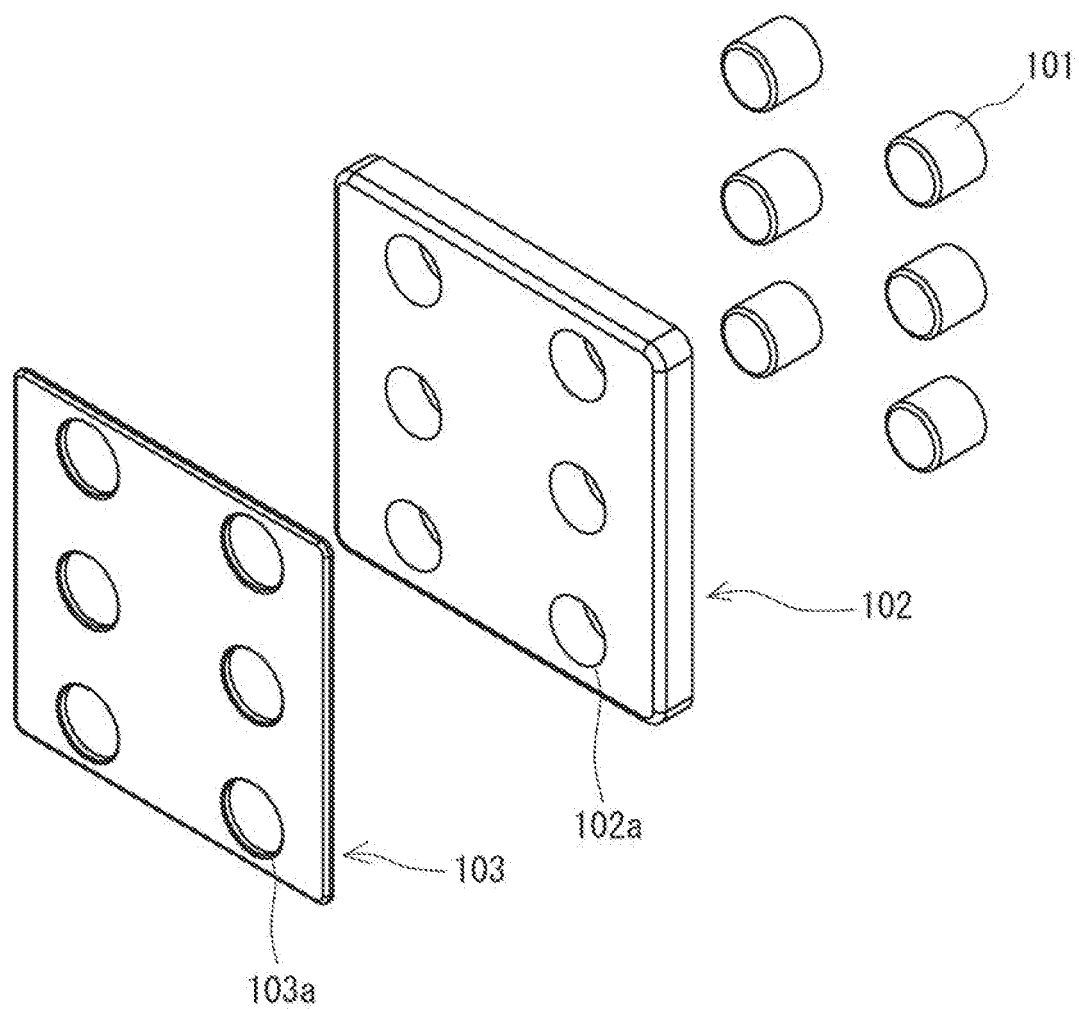
FIG. 17A shows a state in which ordinary circular buttons, a first cover, and a second cover are separated from one another.
Figure 17B:
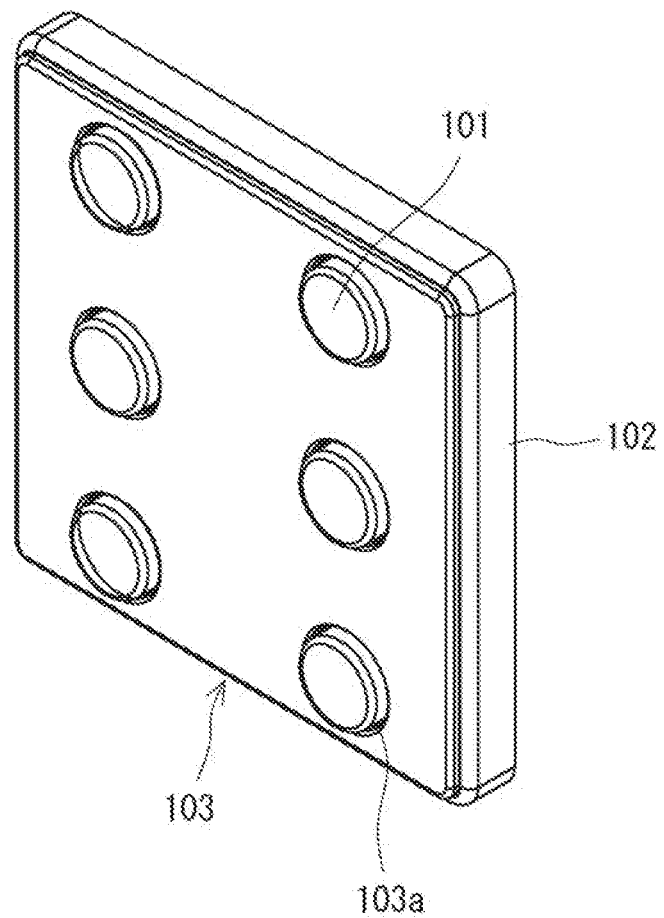
FIG. 17B shows a state in which the ordinary circular buttons have been passed through through holes formed in the first and second covers.
Figure 18A:
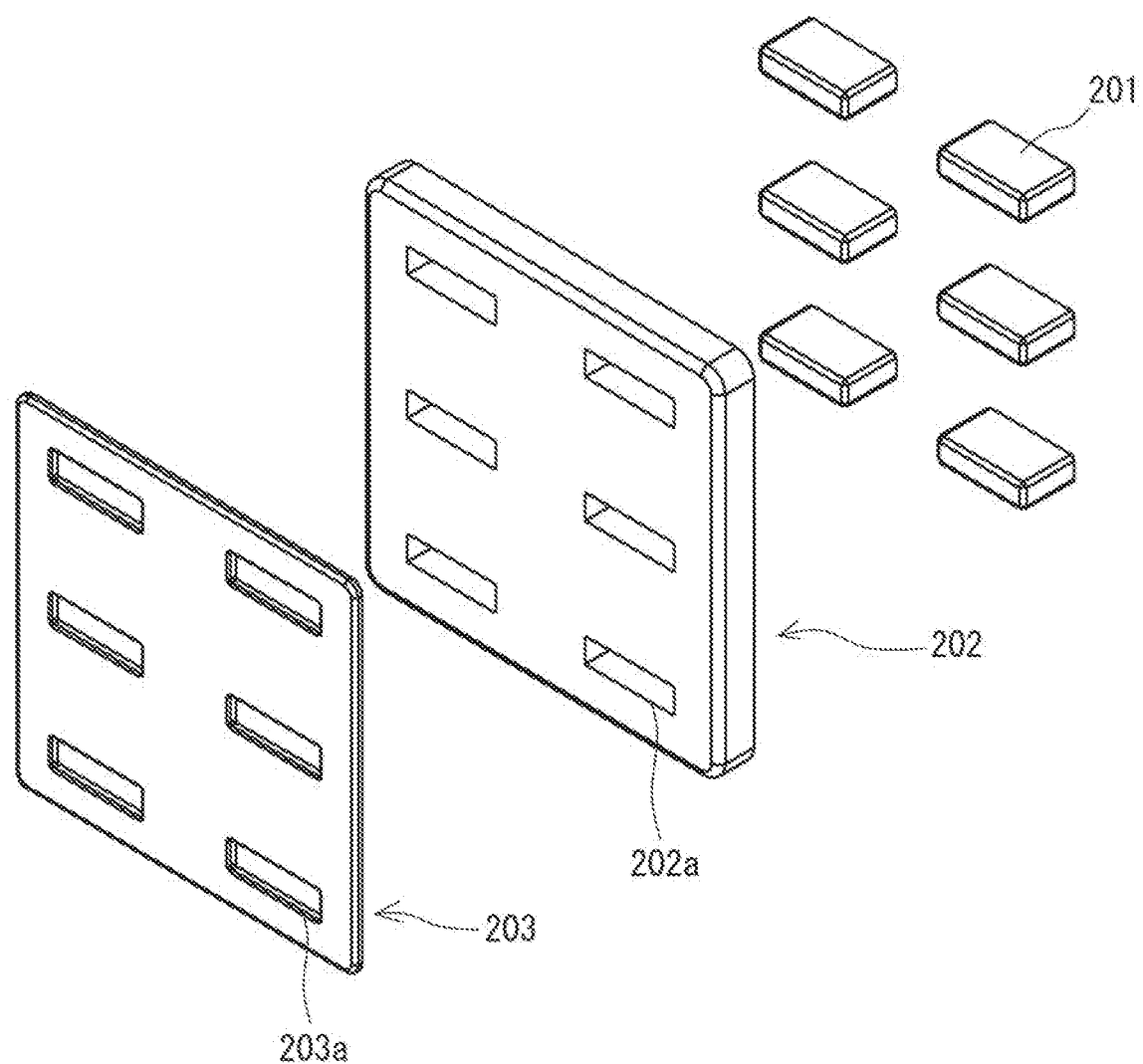
FIG. 18A shows a state in which ordinary rectangular buttons, a first cover, and a second cover are separated from one another.
Figure 18B:
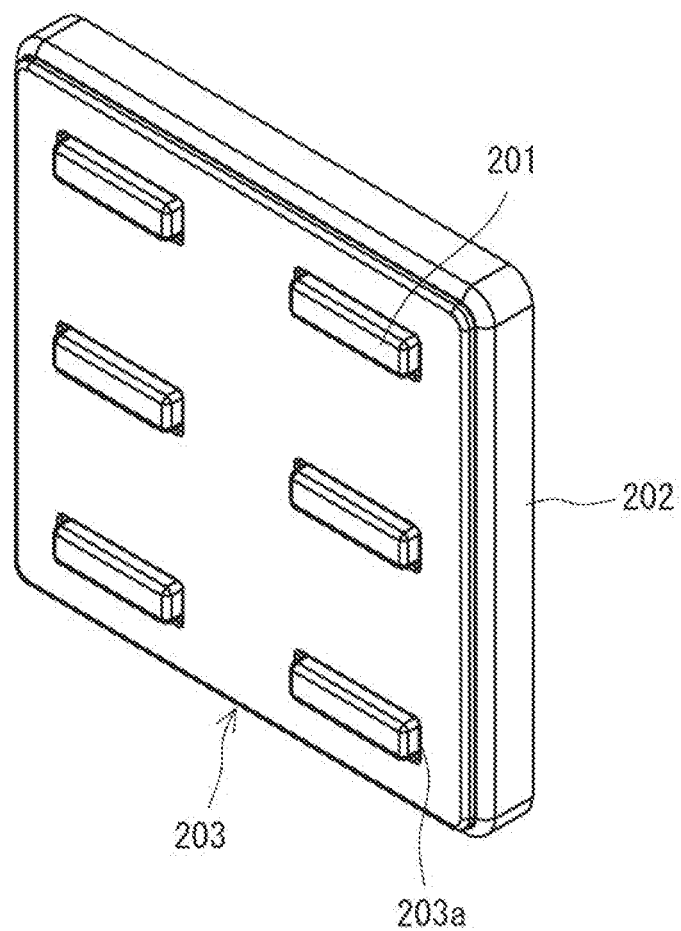
FIG. 18B shows a state in which the ordinary rectangular buttons have been passed through through holes formed in the first and second covers.

Next, an example to which the cover 1 according to this example embodiment is applied will be described. FIG. 13 is an exploded view schematically showing a desk telephone in which a cover and first buttons according to this example embodiment are used. FIG. 14 is an assembly diagram schematically showing the desk telephone in which the cover and the first buttons according to the example embodiment are used. FIG. 15 is an exploded view schematically showing a desk telephone in which a cover and second buttons according to this example embodiment are used. FIG. 16 is an assembly diagram schematically showing the desk telephone in which the cover and the second buttons according to this example embodiment are used.

As shown in FIGS. 13 and 15, a cover 1 according to this example embodiment can be applied to at least a part of a cover of a desk telephone 40, which is an example of the electronic apparatus. Specifically, the desk telephone 40 includes a housing 41 in which a circuit board or the like for implementing functions as the desk telephone 40 is disposed, a first cover 42 a part of which the cover 1 according to this example embodiment is applied to, buttons 43, and a handset unit 44. Note that since the details of the desk telephone 40 are not essential to the present disclosure, descriptions thereof will be omitted.

In the desk telephone 40, since the cover 1 according to this example embodiment is applied to a part of the first cover 42, there is no need to change the design of the first cover 42 irrespective of whether circular buttons or rectangular buttons are adopted as the buttons 43 of the desk telephone 40. Therefore, it is possible to reduce the manufacturing cost of the desk telephone 40, which is the electronic apparatus.

Note that as shown in FIGS. 13 and 15, it is possible to suitably use, as the buttons 43, the above-described first buttons 2, whose basic forms are circular buttons, and/or the second buttons 3, whose basic forms are rectangular buttons. As a result, it is possible to prevent foreign substances from entering from any parts of the through holes 10 of the first cover 42 other than the parts thereof into which the body parts of the buttons are inserted.

Note that as shown in FIGS. 14 and 16, the desk telephone 40 preferably includes a second cover 45 that covers the first and second projection parts 13 and 14 or the first and second arc parts 11 and 12 of the through holes 10 formed in the first cover 42. In the second cover 45, circular or rectangular through holes 45a having shapes conforming to the shapes of the parts on the Z-axis positive side of the buttons 43 are formed so that the parts on the Z-axis positive side of the buttons 43 are inserted thereinto. Further, the second cover 45 covers the first and second projection parts 13 and 14 or the first and second arc parts 11 and 12 of the through holes 10 formed in the first cover 42 in a state where the ends on the Z-axis positive side of the buttons 43 are inserted into these through holes 45a.

As a result, it is possible to prevent foreign substances from entering gaps between the first and second projection parts 13 and 14 or the first and second arc parts 11 and 12 of the through holes 10 formed in the first cover 42 and the projection parts of the buttons 43 (i.e., the first and second projection parts 21 and 22 of the first buttons 2, or the first and second projection parts 31 and 32 of the second buttons 3). In addition, it is possible to improve the design of the external appearance of the desk telephone 40.

Although the present disclosure is explained above with reference to example embodiments, the present disclosure is not limited to the above-described example embodiments. Various modifications that can be understood by those skilled in the art can be made to the configuration and details of the present disclosure within the scope of the invention.

Although the cover 1 of the above-described example embodiment is applied to the first cover 42 of the desk telephone 40, it can be applied to any electronic apparatus that is operated by using either circular buttons or rectangular buttons.

REFERENCE SIGNS LIST

1 COVER (COVER FOR ELECTRONIC APPARATUS)
10 THROUGH HOLE
11 FIRST ARC PART
12 SECOND ARC PART
13 FIRST PROJECTION PART
14 SECOND PROJECTION PART
2 FIRST BUTTON
20 BODY PART
21 FIRST PROJECTION PART
22 SECOND PROJECTION PART
3 SECOND BUTTON
30 BODY PART

31 FIRST PROJECTION PART
32 SECOND PROJECTION PART
40 DESK TELEPHONE
42 FIRST COVER
43 BUTTON
45 SECOND COVER
45a THROUGH HOLE

The invention claimed is:

1. An electronic apparatus comprising:
a first cover and a button, wherein
the first cover comprises a through hole into which the button is inserted,
the through hole being surrounded by:
a first arc part centered at a predefined point;
a second arc part positioned to be opposed to the first arc part in a first direction parallel to a surface of the first cover, the second arc part being centered at the predefined point and having a diameter equal to that of the first arc part;
a first projection part forming a first rectangular area projecting from a first end of the first arc part and a first end of the second arc part, the first rectangular area projecting outward with respect to the predefined point in a second direction, the second direction being parallel to the surface of the first cover and orthogonal to the first direction; and
a second projection part forming a second rectangular area projecting from a second end of the first arc part and a second end of the second arc part, the second rectangular area projecting outward with respect to the predefined point in the second direction, and
the button comprises:
a circular body part having a diameter equal to that of the first and second arc parts of the first cover;
a first projection part having a first peripheral edge identical to that of a first projection part of the first cover, the first projection part being a first rectangular projection projecting from a first part of the circular body part in a third direction orthogonal to the surface of the first cover; and
a second projection part having a second peripheral edge identical to that of the second projection part of the first cover, the second projection part being a second rectangular projection that projects from a second part of the circular body part in the third direction so that the second projection part is opposed to the first projection part in the second direction.

2. The electronic apparatus according to claim 1, wherein the through hole of the first cover is a first through hole, and the electronic apparatus further comprises a second cover, wherein
the second cover has a second through hole into which the circular body part of the button in the third direction is inserted, and
the second cover is configured to cover and cover the first and second projection parts of the first cover.

3. An electronic apparatus comprising
a first cover and a button, wherein
the first cover comprises a through hole into which the button is inserted,
the through hole being surrounded by:
a first arc part centered at a predefined point;
a second arc part positioned to be opposed to the first arc part in a first direction parallel to a surface of the first cover, the second arc part being centered at the predefined point and having a diameter equal to that of the first arc part;
a first projection part forming a first rectangular area projecting from a first end of the first arc part and a first end of the second arc part, the rectangular area projecting outward with respect to the predefined point in a second direction, the second direction being parallel to the surface of the first cover and orthogonal to the first direction; and
a second projection part forming a second rectangular area projecting from a second end of the first arc part and a second end of the second arc part, the rectangular area projecting outward with respect to the predefined point in the second direction, and
the button comprises:
a rectangular body part having peripheral edges on both sides thereof in the second direction, the peripheral edges being identical to those of the first and second projection parts of the first cover;
a first projection part having a first peripheral edge identical to that of a first arc part of the first cover, the first projection part being a first arcuate projection that projects from a first part of the rectangular body part in a third direction orthogonal to a surface of the first cover; and
a second projection part having a second peripheral edge identical to that of a second arc part of the first cover, the second projection part being a second arcuate projection that projects from a second part of the rectangular body part in the third direction so that the second projection part is opposed to the first projection part in the first direction.

4. The electronic apparatus according to claim 3, wherein the through hole of the first cover is a first through hole, and the electronic apparatus further comprises a second cover, wherein
the second cover has a second through hole into which the rectangular body part of the button in the third direction is inserted, and
the second cover is configured to cover the first cover, and cover the first and second arc parts of the first cover.

* * * * *